(12) United States Patent  (10) Patent No.: US 8,982,577 B1
Fuentes  (45) Date of Patent: Mar. 17, 2015

(54) ELECTRONIC COMPONENT PACKAGE HAVING BLEED CHANNEL STRUCTURE AND METHOD

(75) Inventor: Ruben Fuentes, Gilbert, AZ (US)

(73) Assignee: Amkor Technology, Inc.

( * ) Notice: Subject to any disclaimer, the term of this patent is extended or adjusted under 35 U.S.C. 154(b) by 247 days.

(21) Appl. No.: 13/399,321

(22) Filed: Feb. 17, 2012

(51) Int. Cl.
 *H05K 7/00* (2006.01)
 *H01J 23/28* (2006.01)

(52) U.S. Cl.
 USPC .......................................... 361/783; 257/787

(58) Field of Classification Search
 CPC ..................................................... H01L 25/072
 See application file for complete search history.

(56) References Cited

U.S. PATENT DOCUMENTS

| | | | | |
|---|---|---|---|---|
| 5,953,594 | A * | 9/1999 | Bhatt et al. | 438/125 |
| 6,614,122 | B1 * | 9/2003 | Dory et al. | 257/787 |
| 6,818,538 | B2 | 11/2004 | Chiang et al. | |
| 6,853,089 | B2 | 2/2005 | Ujiie et al. | |
| 6,975,035 | B2 * | 12/2005 | Lee | 257/778 |
| 7,023,084 | B2 * | 4/2006 | Tomabechi et al. | 257/720 |
| 7,183,657 | B2 * | 2/2007 | Furtaw et al. | 257/783 |
| 7,359,211 | B2 * | 4/2008 | Landeros et al. | 361/760 |
| 7,598,119 | B2 * | 10/2009 | Martinez et al. | 438/106 |
| 7,755,176 | B1 | 7/2010 | St. Amand et al. | |
| 8,536,718 | B2 * | 9/2013 | Ko et al. | 257/787 |
| 2002/0088632 | A1 * | 7/2002 | Salatino et al. | 174/52.1 |
| 2003/0080439 | A1 | 5/2003 | Lin et al. | |
| 2004/0169273 | A1 | 9/2004 | Chiang et al. | |
| 2004/0170006 | A9 * | 9/2004 | Sylvester et al. | 361/794 |
| 2005/0151272 | A1 * | 7/2005 | Street et al. | 257/787 |
| 2005/0195582 | A1 * | 9/2005 | Landeros et al. | 361/760 |
| 2007/0096315 | A1 * | 5/2007 | Manens et al. | 257/737 |
| 2008/0225491 | A1 * | 9/2008 | Martinez et al. | 361/709 |
| 2010/0019373 | A1 | 1/2010 | Fan | |
| 2010/0295079 | A1 * | 11/2010 | Melman | 257/98 |
| 2011/0115083 | A1 | 5/2011 | Zang et al. | |
| 2011/0316162 | A1 * | 12/2011 | Ko et al. | 257/773 |

* cited by examiner

*Primary Examiner* — Hoa C Nguyen
*Assistant Examiner* — Xanthia C Cunningham
(74) *Attorney, Agent, or Firm* — McAndrews, Held & Malloy, Ltd.

(57) ABSTRACT

A bleed channel electronic component package includes a substrate having an upper solder mask. To mount an electronic component to the substrate, an inactive surface of the electronic component is placed into an adhesive on the substrate. As the adhesive is squeezed between the electronic component and the upper solder mask, the adhesive bleeds laterally outwards past sides of the electronic component. However, bleed channels are formed in the upper solder mask directly adjacent and around the electronic component. Thus, the adhesive bleed flows into the bleed channels, and is captured therein. In this manner, the lateral spread of the adhesive bleed is minimized.

20 Claims, 8 Drawing Sheets

ELECTRONIC COMPONENT PACKAGE HAVING BLEED CHANNEL STRUCTURE AND METHOD

TECHNICAL FIELD

The present application relates to the field of electronics, and more particularly, to methods of forming electronic component packages and related structures.

BACKGROUND

In a wire bond package, an inactive surface of an electronic component is attached to a substrate with adhesive. However, the adhesive bleeds beyond the electronic component when the electronic component is placed. To allow a wirebond connection to a terminal of the substrate, it is important that the adhesive does not bleed and cover the terminal. Unfortunately, this places a restriction on how close the terminal can be placed to the electronic component.

In a flip chip package, an underfill is applied between an electronic component and a substrate. However, the underfill bleeds beyond the electronic component. To allow additional components, e.g., passive components, to be mounted to terminals of the substrate, it is important that the underfill does not bleed to cover the terminals. Unfortunately, this places a restriction on how close the terminals can be placed to the electronic component.

BRIEF DESCRIPTION OF THE DRAWINGS

In the following description, the same or similar elements are labeled with the same or similar reference numbers.

DETAILED DESCRIPTION

Figure 1:
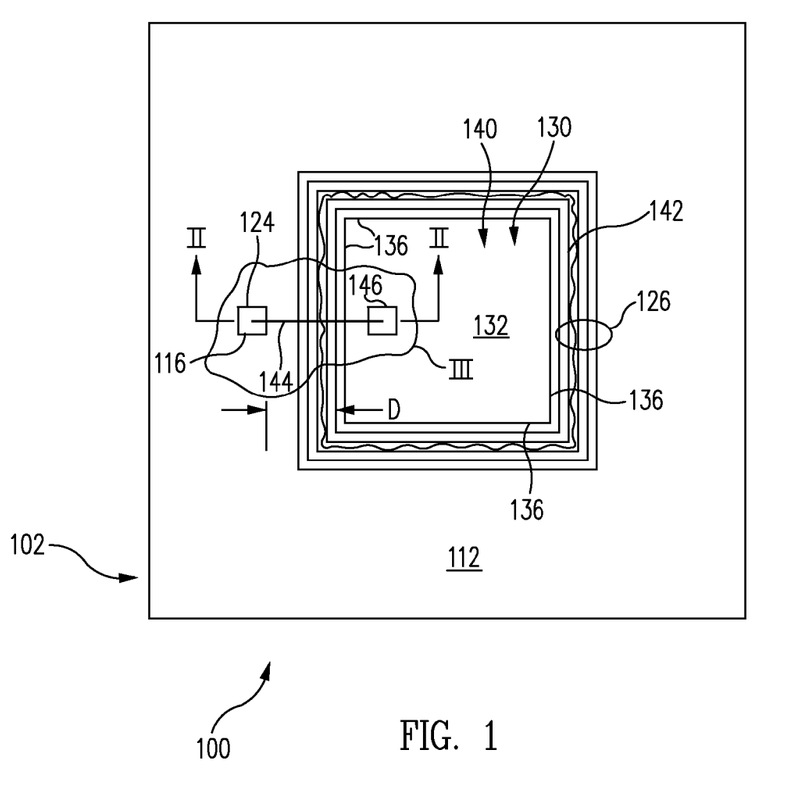
FIG. 1 is a top plan view of a bleed channel electronic component package in accordance with one embodiment.
Figure 2:
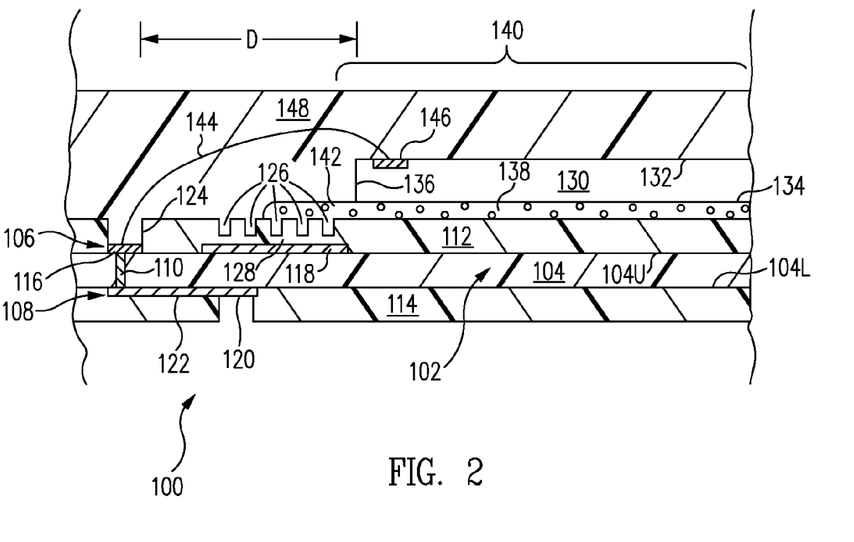
FIG. 2 is a cross-sectional view of the bleed channel electronic component package along the line II-II of FIG. 1 in accordance with one embodiment.
Figure 3:
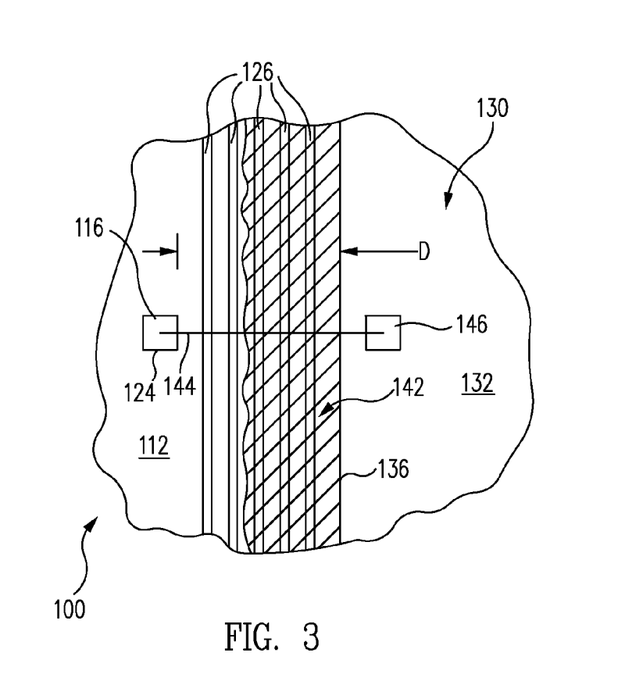
FIG. 3 is an enlarged top plan view of the region III of the bleed channel electronic component package of FIG. 1 in accordance with one embodiment.

As an overview and in accordance with one embodiment, referring to FIGS. 1, 2, and 3 together, a bleed channel electronic component package 100 includes a substrate 102 having an upper solder mask 112. To mount an electronic component 130 to substrate 102, an inactive surface 134 of electronic component 130 is placed into adhesive 138 on substrate 102.

As adhesive 138 is squeezed between electronic component 130 and upper solder mask 112, adhesive 138 bleeds laterally outwards past sides 136 of electronic component 130 as adhesive bleed 142. However, bleed channels 126 are formed in upper solder mask 112 directly adjacent and around electronic component 130.

Thus, adhesive bleed 142 flows into bleed channels 126, and is captured therein. In this manner, the lateral spread of adhesive bleed 142 is minimized. This allows the lateral distance D between terminals 116 and sides 136 of electronic component 130 to be minimized thus minimizing the overall size of bleed channel electronic component package 100.

Now in more detail, FIG. 1 is a top plan view of a bleed channel electronic component package 100 in accordance with one embodiment. FIG. 2 is a cross-sectional view of bleed channel electronic component package 100 along the line II-II of FIG. 1 in accordance with one embodiment. FIG. 3 is an enlarged top plan view of the region III of bleed channel electronic component package 100 of FIG. 1 in accordance with one embodiment.

Referring now to FIGS. 1, 2, and 3 together, bleed channel electronic component package 100 includes a substrate 102. In accordance with this embodiment, substrate 102 includes a dielectric core 104, an upper, e.g., first, circuit pattern 106, a lower, e.g., second, circuit pattern 108, vias 110, an upper, e.g., first, solder mask 112, and a lower, e.g., second, solder mask 114.

Dielectric core 104 is a dielectric material, e.g., printed circuit board, ceramic, laminate, tape, or other dielectric material. Dielectric core 104 includes an upper, e.g., first, surface 104U and a lower, e.g., second, surface 104L.

Upper circuit pattern 106 is formed on or embedded within upper surface 104U of dielectric core 104. In accordance with this embodiment, upper circuit pattern 106 includes one or more terminals 116 and/or one or more traces 118. Terminals 116 are sometimes called bond fingers or lands. Traces 118 are long thin electrical conductors extending along upper surface 104U or other patterned electrical conductors.

Similarly, lower circuit pattern 108 is formed on or embedded within lower surface 104L of dielectric core 104. Lower circuit pattern 108 includes one or more lands 120 and/or one or more traces 122. Lands 120 are for electrically connecting bleed channel electronic component package 100 to other structures, e.g., to a printed circuit motherboard. Traces 122 are long thin electrical conductors extending along lower surface 104L or other patterned electrical conductors.

Vias 110 electrically connect upper circuit pattern 106 and lower circuit pattern 108 through dielectric core 104. Although vias 110 are illustrated as extending straight through dielectric core 104, in other embodiments, dielectric core 104 is a multilayer structure including a plurality of conductor layers and vias that electrically connect upper circuit pattern 106 and lower circuit pattern 108.

Upper solder mask 112 is formed on upper surface 104U of dielectric core 104 and covers upper circuit pattern 106. Upper solder mask 112 is patterned to form terminal openings 124 therein that expose respective terminals 116 of upper circuit pattern 106.

Further, upper solder mask 112 is patterned to form one or more bleed channels 126 therein. In one embodiment, bleed channels 126 are formed by laser ablating upper solder mask 112. By using laser ablation, the depth, width, and pattern of bleed channels 126 is accurately controlled. Further, by using laser ablation, bleed channels 126 can be formed with minimum size. However, in other embodiments, bleed channels 126 are formed using techniques other than laser ablation, e.g., by etching.

Paying particular attention to FIG. 2, bleed channels 126 extend only partially into upper solder mask 112 such that an isolation portion 128 of upper solder mask 112 remains above upper surface 104U of dielectric core 104 and upper circuit pattern 106 and below bleed channels 126. Isolation portion 128 electrically isolates upper surface 104U of dielectric core 104 and upper circuit pattern 106 from conductive material, e.g., conductive epoxy, placed within bleed channels 126 as discussed further below.

Bleed channel electronic component package 100 further includes an electronic component 130. Electronic component 130 is an active component, e.g., an integrated circuit chip, a passive component, e.g., a resistor, capacitor, or inductor, or is another type of electronic component.

In accordance with this embodiment, electronic component 130 includes an active, e.g., first, surface 132, an opposite inactive surface 134, and sides 136 extending perpendicularly between active surface 132 and inactive surface 134. Although various feature herein may be described as being parallel, perpendicular, or having other relations, in light of this disclosure, those of skill in the art will understand the features may not be exactly, parallel or perpendicular, but only substantially parallel or perpendicular to within accepted manufacturing tolerances.

Electronic component 130 is mounted in a wirebond configuration. More particularly, inactive surface 134 is attached to upper solder mask 112 with an adhesive 138, sometimes called a die attach adhesive, e.g., epoxy. More particularly, adhesive 138 is dispensed, e.g., on to a die attach area 140 of upper solder mask 112. Die attach area 140 is the area of upper solder mask 112 where electronic component 130 is to be attached. Die attach area 140 is also sometimes called the shadow area of electronic component 130. Bleed channels 126 are laterally located between die attach area 140 and terminal 116.

Inactive surface 134 of electronic component 130 is then pressed into adhesive 138 directly above die attach area 140. As adhesive 138 is squeezed between electronic component 130 and upper solder mask 112, adhesive 138 bleeds laterally outwards past sides 136 of electronic component 130. This excess adhesive 138 that bleeds laterally outwards past sides 136 of electronic component 130 is hereinafter referred to as adhesive bleed 142.

However, bleed channels 126 are formed directly adjacent and around die attach area 140 and electronic component 130. In accordance with this embodiment, five bleed channels 126 are formed around die attach area 140. Generally, at least one bleed channel 126 is formed. In another embodiment, instead of distinct bleed channels 126, upper solder mask 112 is roughened around die attach area 140 and electronic component 130 and this roughened area is referred to herein as a bleed channel.

As illustrated in FIG. 1, from the top plan view, electronic component 130 and thus die attach area 140 are rectangular, e.g., square. Bleed channels 126 are also rectangular, e.g., square. More particularly, bleed channels 126 become progressively larger away from die attach area 140.

Thus, adhesive bleed 142 flows from die attach area 140 into bleed channels 126, and is captured therein. More particularly, bleed channels 126 provide a volume or reservoir which is filled with adhesive bleed 142 thus minimizing the spread of adhesive bleed 142. In FIGS. 1 and 3, the bleed channels 126 covered by adhesive bleed 142 would ordinarily not be visible but are illustrated to demonstrate principals in accordance with this embodiment.

In this manner, the lateral spread of adhesive bleed 142 is minimized. Stated another way, adhesive bleed 142 extends laterally outward from die attach area 140 and sides 136 of electronic component 130 less distance than if adhesive bleed 142 was bleeding across a smooth solder mask. This allows the lateral distance D between terminals 116 of upper circuit pattern 106 and sides 136 of electronic component 130 to be minimized.

By minimizing the lateral distance D, the overall size of bleed channel electronic component package 100 is also minimized. Further, the length of bond wires 144 electrically connecting bond pads 146 on active surface 132 of electronic component 130 and terminals 116 is also minimized. By minimizing the length of bond wires 144, electrical performance is maximized.

In one embodiment, adhesive 138 is electrically conductive. However, as discussed above, bleed channels 126 extend only partially into upper solder mask 112 such that isolation portion 128 remains between bleed channels 126 and upper circuit pattern 106. Accordingly, isolation portion 128 prevents contact of adhesive 138 with upper circuit pattern 106 and shorting thereto. Stated another way, isolation portion 128 electrically isolates adhesive 138 from upper circuit pattern 106.

Although only a single terminal 116, a single bond wire 144, and a single bond pad 146 are illustrated in the figures, in light of this disclosure, those of skill in the art will understand that bleed channel electronic component package 100 typically includes a plurality of terminals 116, bond wires 144, and bond pads 146 depending upon the particular input/output required.

Further, bleed channel electronic component package 100 includes a dielectric package body 148, e.g., encapsulant, mold compound, or other dielectric material. Package body 148 covers and protects electronic component 130, bond wires 144, and the exposed portion of substrate 102. Package body 148 is not illustrated in FIGS. 1, 3 to allow visualization of the feature that would ordinarily be covered and obscured by package body 148.

Figure 4:
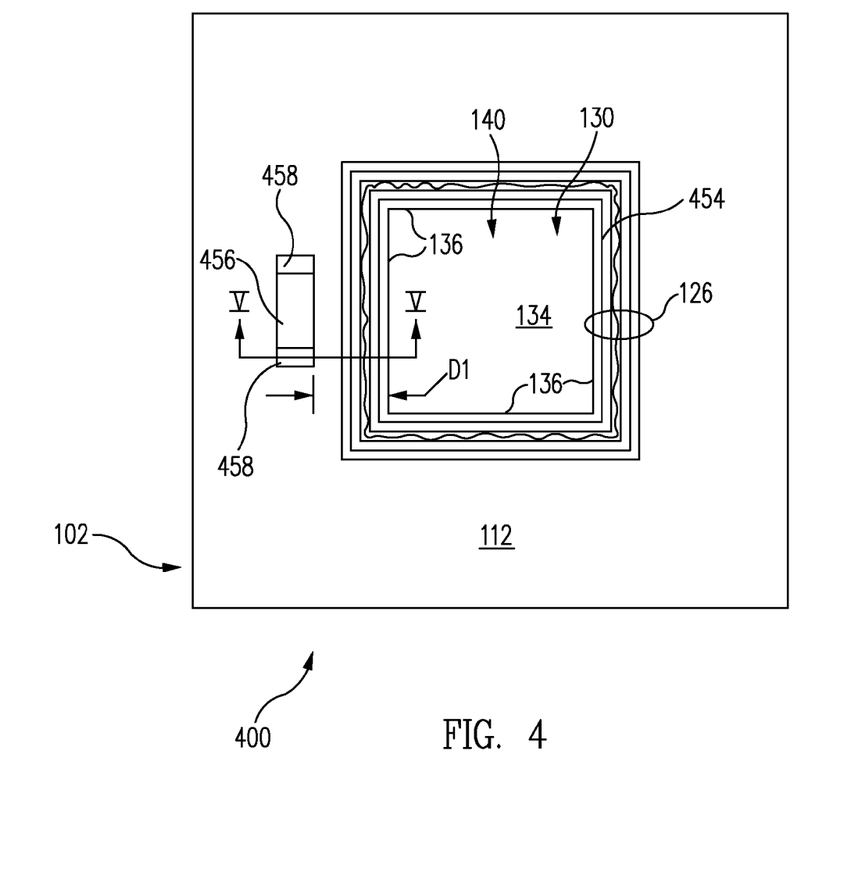
FIG. 4 is a top plan view of a bleed channel electronic component package in accordance with another embodiment.
Figure 5:
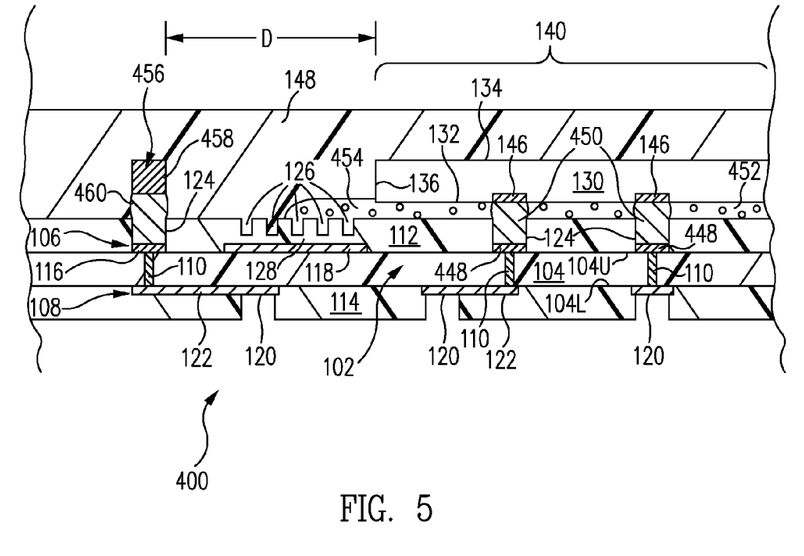
FIG. 5 is a cross-sectional view of the bleed channel electronic component package along the line V-V of FIG. 4 in accordance with one embodiment.

FIG. 4 is a top plan view of a bleed channel electronic component package 400 in accordance with another embodiment. FIG. 5 is a cross-sectional view of bleed channel electronic component package 400 along the line V-V of FIG. 4 in accordance with one embodiment. Bleed channel electronic component package 400 of FIGS. 4 and 5 is similar to bleed channel electronic component package 100 of FIGS. 1 and 2 and only the significant differences are discussed below.

Referring now to FIGS. 4 and 5 together, in accordance with this embodiment, electronic component 130 is mounted in a flip chip configuration. More particularly, upper circuit pattern 106 further includes flip chip terminals 448 exposed through terminal openings 124 of upper solder mask 112. Bond pads 146 are physically and electrically connected to flip chip terminals 448 by flip chip bumps 450, e.g., solder bumps.

A dielectric underfill 452 is applied between active surface 132 of electronic component 130 and upper solder mask 112. Underfill 452 surrounds flip chip bumps 450 and enhances the reliability of the flip chip mounting of electronic component 130.

However, underfill 452 bleeds laterally outwards from die attach area 140 and past sides 136 of electronic component 130. This excess underfill 452 that bleeds laterally outwards past sides 136 of electronic component 130 is hereinafter referred to as underfill bleed 454.

However, bleed channels 126 are formed directly adjacent and around die attach area 140 and electronic component 130. Thus, underfill bleed 454 flows from die attach area 140 into bleed channels 126, and is captured therein. More particularly, bleed channels 126 provide a volume or reservoir which is filled with underfill bleed 454 thus minimizing the spread of underfill bleed 454.

In this manner, the lateral spread of underfill bleed 454 is minimized. Stated another way, underfill bleed 454 extends laterally outward from die attach area 140 and sides 136 of electronic component 130 less distance than if underfill bleed 454 was bleeding across a smooth solder mask. This allows the lateral distance D1 between terminals 116 of upper circuit pattern 106 and sides 136 of electronic component 130 to be minimized.

In one embodiment, one or more secondary electronic components 456 or other objects, e.g., passive components, are mounted, e.g., Surface Mounted Technology (SMT) mounted, to terminals 116. Illustratively, terminals 458 of secondary electronic component 456 are mounted to terminals 116 of upper circuit pattern 106 with solder joints 460, although are electrical connected in a different manner in other embodiments.

By using bleed channels 126 to minimizing the lateral distance D1 between terminals 116 and electronic component 130 as discussed above, the separation between secondary electronic component 456 and electronic component 130 is also minimized. This, in turn, minimizes the overall size of bleed channel electronic component package 400.

Figure 6:
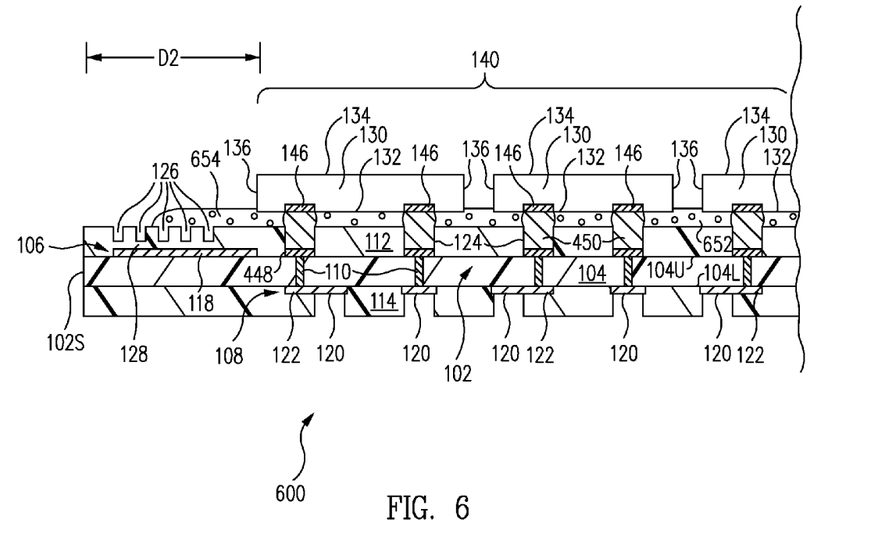
FIG. 6 is a cross-sectional view of a bleed channel electronic component package in accordance with another embodiment.

FIG. 6 is a cross-sectional view of a bleed channel electronic component package 600, sometimes called an assembly, in accordance with another embodiment. Bleed channel electronic component package 600 is similar to bleed channel electronic component package 400 of FIG. 5 and only the significant differences are discussed below.

In accordance with this embodiment, referring to FIG. 6, a plurality of electronic components 130 are flip chip mounted to substrate 102.

A dielectric underfill 652 is applied between active surfaces 132 of electronic components 130 and upper solder mask 112. Underfill 652 surrounds flip chip bumps 450 and enhances the reliability of the flip chip mounting of electronic components 130.

However, underfill 652 bleeds laterally outwards from die attach area 140 and past sides 136 of the outermost electronic component 130. This excess underfill 652 that bleeds laterally outwards past sides 136 of the outermost electronic component 130 is hereinafter referred to as underfill bleed 654. Die attach area 140 is defined as the area to which the plurality of electronic components 130 are mounted in this embodiment.

However, bleed channels 126 are formed directly adjacent and around die attach area 140 and electronic components 130. Thus, underfill bleed 654 flows from die attach area 140 into bleed channels 126, and is captured therein. More particularly, bleed channels 126 provide a volume or reservoir which is filled with underfill bleed 654 thus minimizing the spread of underfill bleed 654.

In this manner, the lateral spread of underfill bleed 654 is minimized. Stated another way, underfill bleed 654 extends laterally outward from die attach area 140 and sides 136 of the outermost electronic component 130 less distance than if underfill bleed 654 was bleeding across a smooth solder mask.

This allows a lateral distance D2 between sides 102S of substrate 102 and sides 136 of the outermost electronic component 130 to be minimized. This, in turn, minimizes the overall size of bleed channel electronic component package 600.

In accordance with another embodiment, substrate 102 is a silicon interposer and instead of having an upper solder mask 112, the silicon interposer includes a dielectric passivation layer. Bleed channels 126 are formed in the passivation layer.

Figure 7:
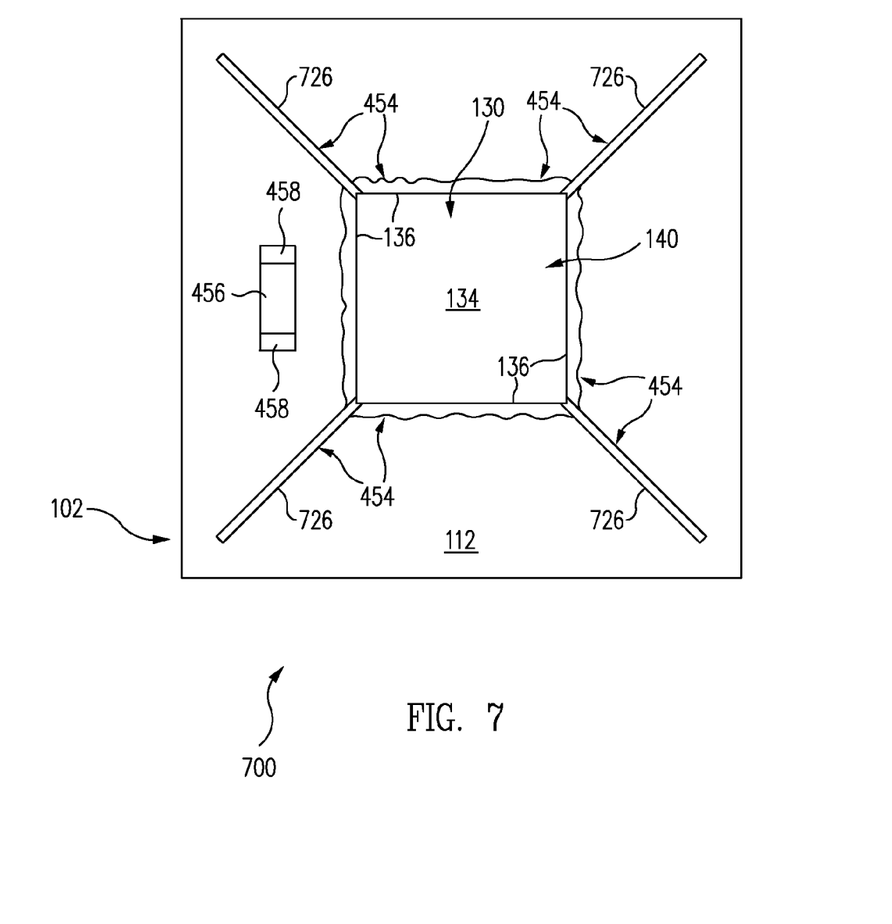
FIG. 7 is a top plan view of a bleed channel electronic component package in accordance with another embodiment.

FIG. 7 is a top plan view of a bleed channel electronic component package 700 in accordance with another embodiment. Bleed channel electronic component package 700 is similar to bleed channel electronic component package 400 of FIG. 4 and only the significant differences are discussed below.

In accordance with this embodiment, referring to FIG. 7, bleed channels 726 formed in upper solder mask 112 extend laterally outward from die attach area 140 and electronic component 130. Accordingly, underfill bleed 454 flows through bleed channels 726 away from electronic component 130. In this manner, underfill bleed 454 can be directed to specific areas of upper solder mask 112.

Bleed channel electronic component package 700 is illustrated and discussed above as using bleed channels 726 to direct underfill bleed 454 away from electronic component 130 mounted in a flip chip configuration. However, in light of this disclosure, referring to FIGS. 1 and 7 together, those of skill in the art will understand that the discussion is equally applicable to using bleed channels 726 to direct adhesive bleed 142 away from electronic component 130 mounted in a wirebond configuration.

Figure 8:
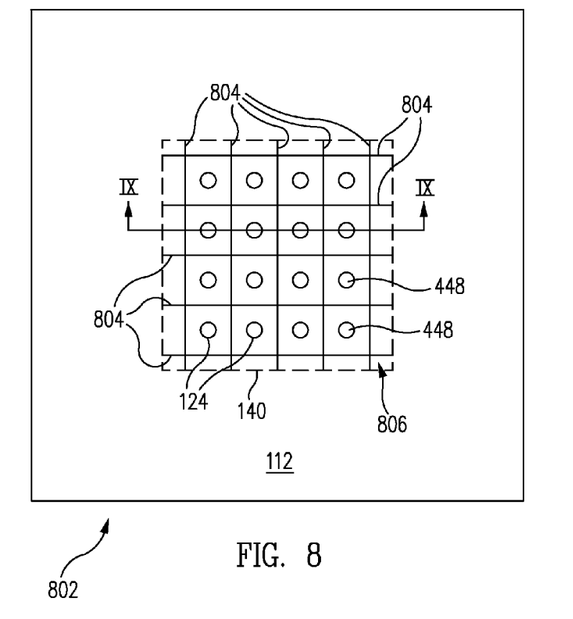
FIG. 8 is a top plan view of a substrate for a flow channel electronic component package in accordance with another embodiment.
Figure 9:
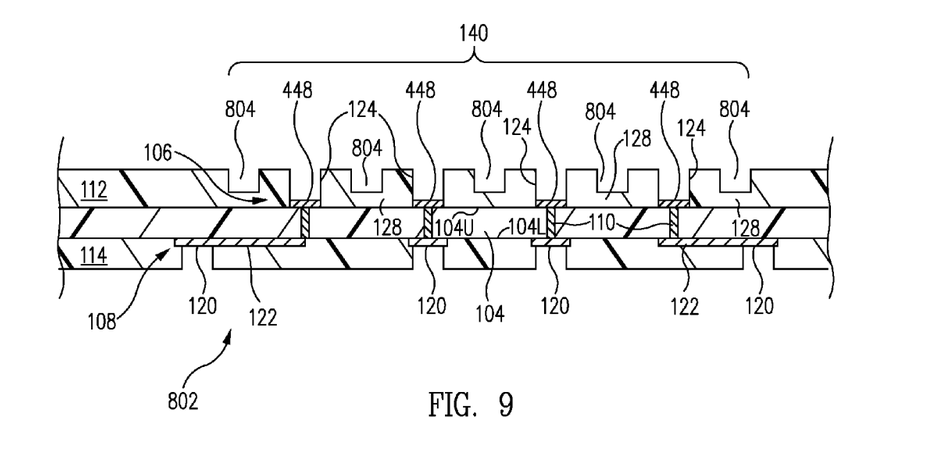
FIG. 9 is a cross-sectional view of the substrate along the line IX-IX of FIG. 8 in accordance with one embodiment.

FIG. 8 is a top plan view of a substrate 802 for a flow channel electronic component package in accordance with another embodiment. FIG. 9 is a cross-sectional view of substrate 802 along the line IX-IX of FIG. 8 in accordance with one embodiment. Substrate 802 of FIG. 8 is similar to substrate 102 of FIG. 5 and only the significant differences between substrates 802 and 102 are discussed below.

Referring to FIGS. 8 and 9 together, substrate 802 includes dielectric core 104, upper solder mask 112, upper circuit pattern 106 including flip chip terminals 448 exposed through terminal openings 124 of upper solder mask 112, vias 110, lower circuit pattern 108, and lower solder mask 114, similar to the respective elements as discussed above in reference to substrate 102 of FIG. 5.

However, in accordance with this embodiment, flow channels 804 are formed within die attach area 140 of substrate 802. Flow channels 804 are formed in a grid pattern 806, sometimes called a crisscross or checkerboard pattern. More particularly, a first plurality of flow channels 804 are arranged parallel to one another in a first direction and a second plurality of flow channels 804 are arranged parallel to one another in a second direction, where the first direction is perpendicular to the second direction. Further, flip chip terminals 448 are located within grid pattern 806.

In a manner similar to that discussed above, in one embodiment, flow channels 804 are formed using laser ablation, and so are sometimes called laser channels. Further, flow channels 804 extend partially into, but not entirely through, upper solder mask 112. However, in another embodiment, flow channels 804 extend entirely though upper solder mask 112.

Figure 10:
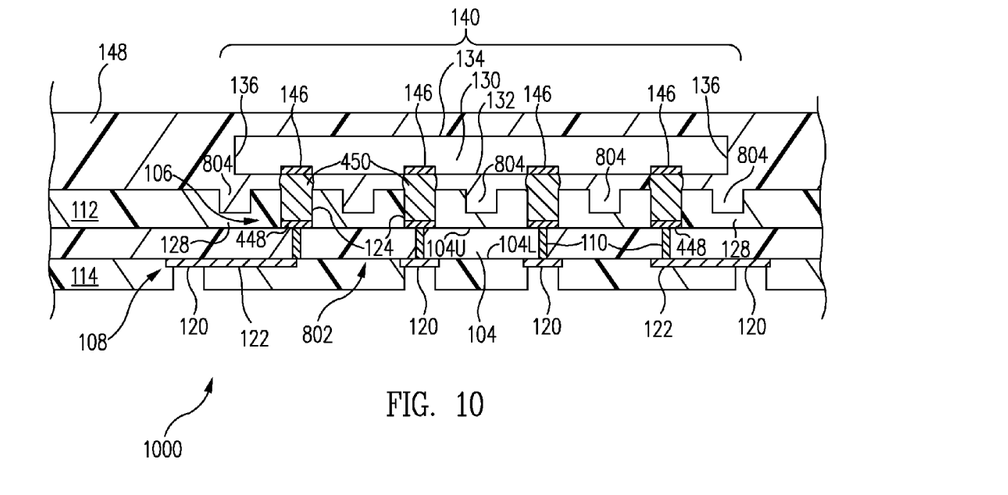
FIG. 10 is a cross-sectional view of a flow channel electronic component package formed with the substrate of FIGS. 8 and 9 in accordance with one embodiment.

FIG. 10 is a cross-sectional view of a flow channel electronic component package 1000 formed with substrate 802 of FIGS. 8 and 9 in accordance with one embodiment. Flow channel electronic component package 1000 is similar to bleed channel electronic component package 400 of FIG. 5 and only the significant differences are discussed below.

Referring now to FIG. 10, electronic component 130 is flip chip mounted to substrate 802. Electronic component 130 including upper solder mask 112 are then encapsulated in a package body 148. In one embodiment, package body 148 is a molded underfill.

As illustrated, package body 148 underfills the region between active surface 132 of electronic component 130 and upper solder mask 112 and encloses flip chip bumps 450. Package body 148 further encloses sides 136 and inactive surface 134 of electronic component 130 and upper solder mask 112.

Package body 148 flows within flow channels 804 during application of package body 148. Accordingly, flow channels 804 enhance flow of package body 148 between active surface 132 of electronic component 130 and upper solder mask 112 during application of package body 148. By enhancing flow of package body 148, flow channels 804 minimize the undesirable formation of voids within package body 148.

Figure 11:
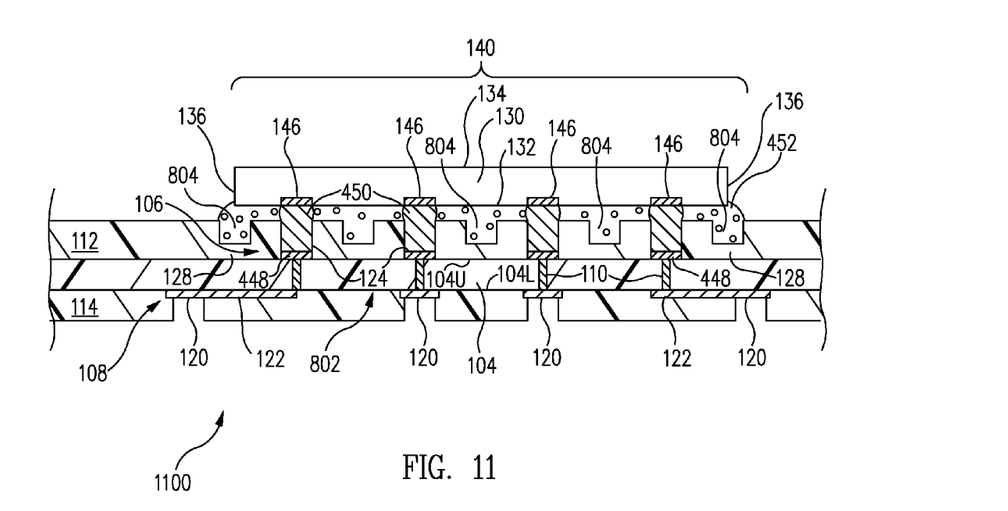
FIG. 11 is a cross-sectional view of a flow channel electronic component package formed with the substrate of FIGS. 8 and 9 in accordance with another embodiment.

FIG. 11 is a cross-sectional view of a flow channel electronic component package 1100 formed with substrate 802 of FIGS. 8 and 9 in accordance with another embodiment. Flow channel electronic component package 1100 is similar to flow channel electronic component package 1000 of FIG. 10 and only the significant differences are discussed below.

Referring now to FIG. 11, electronic component 130 is flip chip mounted to substrate 802. An underfill 452 is applied between active surface 132 of electronic component 130 and upper solder mask 112 and encloses flip chip bumps 450.

Underfill 452 flows within flow channels 804 during application of underfill 452. Accordingly, flow channels 804 enhance flow of the underfill 452 between active surface 132 of electronic component 130 and upper solder mask 112. By enhancing flow of underfill 452, flow channels 804 minimize the undesirable formation of voids within underfill 452.

Although formation of various packages (100, 400, 600, 700) having bleed channels 126, 726 (FIGS. 1-7) and other packages 1000, 1100 having flow channels 804 are illustrated and discussed above, in other embodiments, various packages are fabricated by combining bleed channels and/or flow channels as set forth herein.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A structure comprising:
a dielectric core; and
a first solder mask on a top surface of the dielectric core, the first solder mask comprising:
a die attach area;
a bleed channel, wherein the bleed channel is terminated at a bottom end by the first solder mask; and
an isolation portion positioned vertically between the top surface of the dielectric core and the bottom end of the bleed channel.

2. The structure of claim 1, further comprising:
a first circuit pattern coupled to the first surface of the dielectric core, at least a portion of the first circuit pattern positioned directly above the first surface of the dielectric core and directly below the bleed channel, the at least a portion of the first circuit pattern isolated from the bleed channel by the isolation portion.

3. The structure of claim 2, wherein the isolation portion of the first solder mask contacts the top of the first circuit pattern and the bottom end of the bleed channel.

4. The structure of claim 3, further comprising an electrically conductive adhesive bleed within the bleed channel and contacting the isolation portion at the bottom end of the bleed channel, the isolation portion electrically isolating the adhesive bleed from the first circuit pattern.

5. The structure of claim 4, wherein the first circuit pattern comprises an active component terminal exposed through the first solder mask for connecting to a die mounted in the die attach area, where the bleed channel is laterally located between the die attach area and the active component terminal.

6. The structure of claim 1, wherein the first solder mask comprises a plurality of rectangular bleed channels that become progressively larger away from the die attach area.

7. The structure of claim 1 wherein the bleed channel is around the die attach area.

8. A structure comprising:
a first solder mask comprising:
a top surface;
a die attach area;
a bleed channel around the die attach area and extending only partially into the first solder mask, wherein the bleed channel is terminated at a bottom end by the first solder mask; and
an isolation portion positioned vertically beneath the bottom end of the bleed channel;
an electronic component coupled to the die attach area; and
a material between the electronic component and the first solder mask, the material extending laterally outward from the electronic component into at least a portion of the bleed channel and contacting the bottom end of the bleed channel.

9. The structure of claim 8, wherein the material comprises an adhesive, and an inactive surface of the electronic component is coupled to the die attach area by the adhesive.

10. The structure of claim 9, further comprising a first circuit pattern comprising a terminal outward of said bleed channel, and wherein a bond pad on an active surface of the electronic component is coupled to the terminal by a bond wire.

11. The structure of claim 8, wherein the first solder mask comprises a second bleed channel that encircles the bleed channel.

12. The structure of claim 11, wherein each of the bleed channel and the second bleed channel completely encircles the die attach area.

13. The structure of claim 8, wherein the first solder mask comprises a second bleed channel that extends radially outward from the die attach area and provides a flow path for the material.

14. The structure of claim 8, further comprising a second electronic component coupled to the die attach area, wherein both the electronic component and the second electronic component are surrounded by the bleed channel.

15. The structure of claim 8, wherein the bleed channel extends longitudinally in a direction laterally outward from the die attach area to direct the material to specific areas of the first solder mask.

16. A structure comprising:
an interposer comprising a dielectric passivation layer comprising:
a die attach area; and
a bleed channel around the die attach area and extending only partially into the passivation layer such that the bleed channel is terminated at a bottom end by the passivation layer, where said bleed channel is between the die attach area and a side of the interposer;
an electronic component coupled to the die attach area; and a material between the electronic component and the passivation layer, the material extending laterally outward from the electronic component into at least a portion of said bleed channel.

17. The structure of claim 16 wherein the electronic component is one of a plurality of electronic components coupled to the die attach area.

18. A structure comprising:
a first solder mask comprising:
   a die attach area;
   a bleed channel, wherein the bleed channel is bounded on at least a first side wall, a second side wall, and a bottom end by the first solder mask; and
   an isolation portion positioned vertically beneath the bottom end of the bleed channel;
an electronic component coupled to the die attach area; and
a material between the electronic component and the first solder mask, the material extending laterally outward from the electronic component into said bleed channel between the first side wall and the second side wall.

19. The structure of claim 18, wherein the bleed channel substantially surrounds the die attach area.

20. The structure of claim 18, wherein the first solder mask comprises a second bleed channel, and wherein each of the first and second bleed channels completely encircles the die attach area.

* * * * *